(12) United States Patent  (10) Patent No.: US 8,253,455 B2
Hyun et al.  (45) Date of Patent: Aug. 28, 2012

(54) DELAY LOCKED LOOP CIRCUIT AND OPERATION METHOD THEREOF

(75) Inventors: Seokhun Hyun, Yongin-si (KR); Junghwan Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/654,864

(22) Filed: Jan. 7, 2010

(65) Prior Publication Data

US 2010/0213992 A1  Aug. 26, 2010

(30) Foreign Application Priority Data

Feb. 20, 2009  (KR) .................. 10-2009-0014447

(51) Int. Cl.
*H03L 7/06* (2006.01)
(52) U.S. Cl. ...................................... 327/147
(58) Field of Classification Search .................. 327/147
See application file for complete search history.

(56) References Cited

U.S. PATENT DOCUMENTS

| 6,518,807 | B1 | 2/2003 | Cho |
| 6,815,985 | B2 | 11/2004 | Jeon |
| 7,336,752 | B2 | 2/2008 | Vlasenko et al. |
| 2004/0000934 | A1 | 1/2004 | Jeon |
| 2004/0125905 | A1 | 7/2004 | Vlasenko et al. |
| 2010/0141328 | A1* | 6/2010 | Meninger et al. ............. 327/512 |

FOREIGN PATENT DOCUMENTS

| JP | 2003-110423 | 4/2003 |
| JP | 2004-048729 | 2/2004 |
| KR | 10-2003-0025326 | 3/2003 |
| KR | 10-2004-0001434 | 1/2004 |
| KR | 10-2005-0091038 | 9/2005 |

* cited by examiner

*Primary Examiner* — Lincoln Donovan
*Assistant Examiner* — Daniel Rojas
(74) *Attorney, Agent, or Firm* — Harness, Dickey & Pierce, P.L.C.

(57) ABSTRACT

A delay locked loop (DLL) circuit includes an analog DLL core and a digital DLL core. The analog DLL core receives an input clock signal of a first operating frequency. The digital DLL core receives an input clock signal of a second operating frequency equal to or lower than the first frequency. The analog and digital DLL cores operate selectively. The DLL core also includes a selection circuit configured to select one of the first and second DLL cores. The selection circuit may operate in response to a detection signal from a frequency detector which detects the frequency of the input clock signal. The selection circuit may also operate in response to a column address strobe writing latency signal that indicates frequency information of the input clock signal.

10 Claims, 5 Drawing Sheets

DELAY LOCKED LOOP CIRCUIT AND OPERATION METHOD THEREOF

CROSS-REFERENCE TO RELATED APPLICATIONS

This U.S. non-provisional patent application claims priority under 35 U.S.C. §119 to Korean Patent Application No. 10-2009-0014447, filed on Feb. 20, 2009, the entire contents of which are hereby incorporated by reference.

BACKGROUND

1. Field

Example embodiments relate to an electronic circuit, and particularly, to a delay locked loop circuit and operation method thereof.

2. Description

A delay locked loop circuit may compare a phase of an input clock signal with a phase of a feedback clock signal and may generate an error signal proportional to the phase difference. The delay locked loop circuit may be used in semiconductor circuits such as semiconductor memory devices or the like.

The delay locked loop circuit may include a phase detector, a charge pump circuit, a loop filter that may be implemented using a low pass filter, for example, and a variable delay circuit.

The phase detector may detect the phase difference between an input clock signal and a feedback clock signal output from the variable delay circuit. The charge pump circuit may charge or discharge an electric charge of the loop filter, in response to the output signal of the phase detector. The variable delay circuit may delay the input clock signal to output the feedback clock signal synchronized with the input clock signal, in response to a voltage corresponding to the electric charge that is charged in or discharged from the loop filter.

SUMMARY

Example embodiments are directed to a delay locked loop circuit including an analog delay locked loop (DLL) core and a digital DLL core. The DLL cores selectively operate according to the frequency of an input clock signal.

According to an example embodiment, the DLL circuit may further include a selection circuit configured to select one of the first and second DLL cores, wherein the selection circuit operates in response to a detection signal from a frequency detector which detects the frequency of the input clock signal.

According to another example embodiment, the selection circuit operates in response to a column address strobe writing latency signal that may indicate frequency information of the input clock signal.

According to example embodiments, the analog DLL core may include at least one differential amplifier type of delay cell having a first speed of operation and a first consumption power, and the digital DLL core may include at least one inverter type of delay cell which has a second speed of operation equal to or lower than the first speed of operation and a second consumption power equal to or lower than the first consumption power.

According to example embodiments, the analog DLL core may include an analog delay circuit having at least one analog delay cell, the analog delay circuit delaying the input clock signal having the first frequency by a first delay time; and an analog phase circuit configured to delay an output of the analog delay circuit by a second delay time to generate a first output signal.

According to example embodiments, the digital DLL core may include a digital delay circuit having at least one digital delay cell, the digital delay circuit configured to delay the input clock signal having the second frequency by a third delay time; a digital phase circuit configured to delay an output of the digital delay circuit by a fourth delay time to generate a second output signal; and an internal power source voltage generator configured to supply a stable internal power source voltage to the digital delay circuit, the digital phase circuit, and the digital level shifter.

According to example embodiments, the analog DLL core may further include an analog amplifier configured to receive the output of the analog phase circuit and generate an amplified first output signal; and a first duty cycle correction circuit configured to correct a duty cycle of the amplified first output signal in response to an output of a duty correction control circuit.

According to example embodiments, the digital DLL core may further include a digital level shifter configured to receive the output of the digital phase circuit and to generate the second signal having an amplified swing width; and a second duty cycle correction circuit configured to correct a duty cycle of the second signal having the amplified swing width in response to the output of the duty correction control circuit.

According to some example embodiments, the analog DLL core may further include a first duty cycle correction circuit configured to correct a duty cycle of the first output signal received from the analog phase circuit; and an analog amplifier configured to receive an output of the first duty cycle correction circuit and generate an amplified first output signal.

According to some example embodiments, the digital DLL core may further include a second duty cycle correction circuit configured to correct a duty cycle of the second signal received from the digital phase circuit; and a digital level shifter configured to receive an output of the second duty cycle correction circuit and generate the second signal having an amplified swing width.

According to an example embodiment, the analog DLL core may further include a duty cycle correction circuit configured to correct a duty cycle of the amplified first output signal and to correct a duty cycle of the second signal having the amplified swing width, the duty cycle correction circuit correcting the duty cycles in response to an output of a duty correction control circuit.

According to example embodiments, a selection circuit may selectively output the amplified first output signal and the second signal having the amplified swing width as an output clock signal of the delay locked loop circuit.

According to another example embodiment, the duty cycle correction circuit may output the amplified first output signal and the second signal having the amplified swing width as an output clock signal of the delay locked loop circuit.

According to an example embodiment, a phase of the clock signal output from the selection circuit may lead a phase of the input clock signal.

According to an example embodiment, the analog DLL core may further include a bias circuit configured to provide a bias voltage to the analog delay circuit, the analog phase circuit, the analog amplifier, the first and second duty cycle correction circuits and the duty correction control circuit in response to a detection signal from a frequency detector which detects the frequency of the input clock signal.

According to another example embodiment, the analog DLL core may further include a bias circuit configured to provide a bias voltage to the analog delay circuit, the analog phase circuit, the analog amplifier, the first and second duty cycle correction circuits and the duty correction control circuit in response to a column address strobe writing latency signal that indicates frequency information of the input clock signal.

According to an example embodiment, a method of operating a delay locked loop circuit may include performing a lock operation using an analog Delay Locked Loop (DLL) core, when a frequency of an input clock signal is a first frequency; and performing a lock operation using a digital DLL core, when the frequency of the input clock signal is a second frequency equal to or lower than the first frequency, wherein the lock operations are performed selectively.

According to another example embodiment, the method of operation may further include generating a detection signal based on a detected frequency of the input clock signal; and selectively performing the lock operations based on the detection signal.

According to yet another example embodiment, the method of operation may further include generating a column address strobe writing latency (CWL) signal; and selectively performing the lock operations based on the generated CWL signal, wherein the CWL signal may indicate a frequency information of the input clock signal.

According to an example embodiment, the lock operation using the analog DLL core may further include delaying the input clock signal of the first frequency using an analog delay circuit; generating, using an analog phase circuit, an output signal by delaying an output of the analog delay circuit; amplifying, using an analog amplifier, an output of the analog phase circuit to generate an amplified output signal; correcting, using a first duty cycle correction circuit, a duty cycle of the amplified output signal; and selectively outputting, using a selection circuit, the amplified output signal as an output clock signal of the delay locked loop circuit.

According to an example embodiment, the lock operation using the digital DLL core may further include delaying the input clock signal of the second frequency using a digital delay circuit; generating, using a digital phase circuit, an output signal by delaying an output of the digital delay circuit; amplifying, using a digital level shifter, an output of the digital phase circuit to generate an amplified output signal; correcting, using a first duty cycle correction circuit, a duty cycle of the amplified output clock signal; and selectively outputting, using a selection circuit, the amplified output signal as an output clock signal of the delay locked loop circuit.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
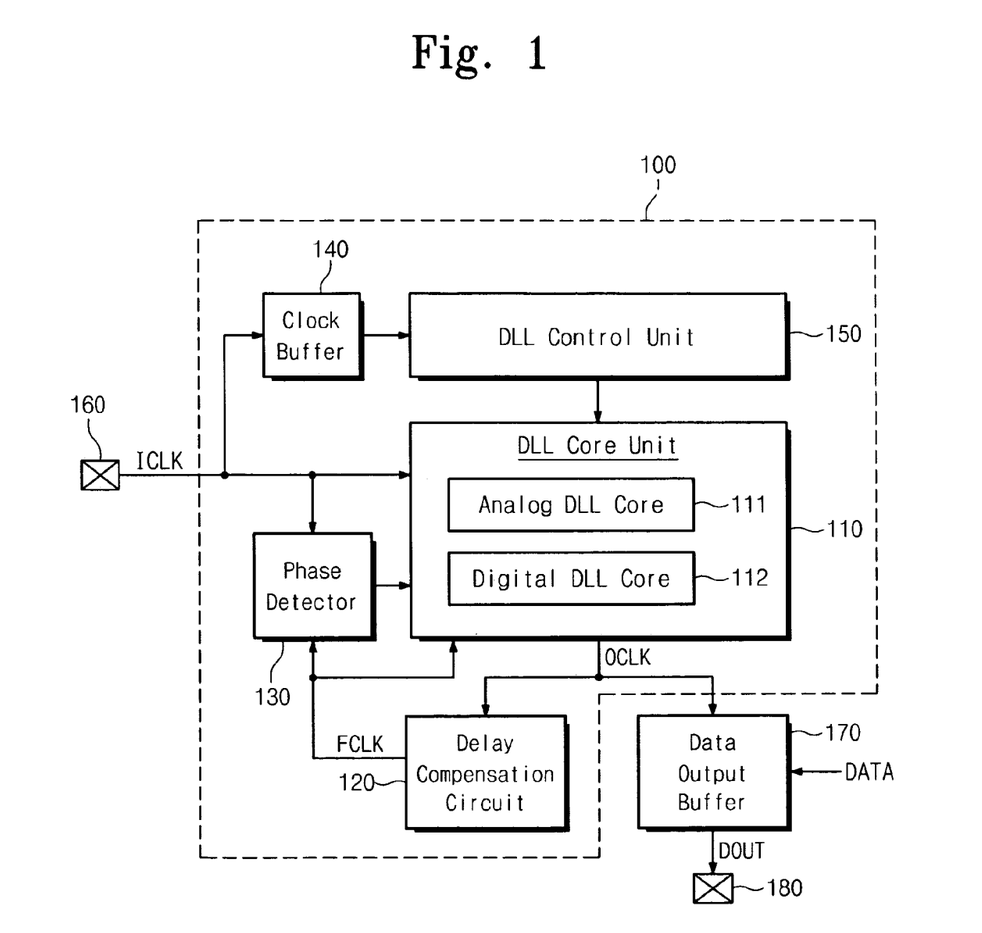
FIG. 1 is a block diagram illustrating a delay locked loop (DLL) circuit according to an example embodiment.

FIG. 1 is a block diagram illustrating a delay locked loop (DLL) circuit according to an example embodiment.

Referring to FIG. 1, a delay locked loop circuit 100 may include a DLL core unit 110, a delay compensation circuit 120, a phase detector 130, a clock buffer 140, and a DLL control unit 150. The DLL circuit 100 may generate a feedback clock signal FCLK having a phase synchronized with the phase of an input clock signal ICLK.

The DLL core unit 110 may delay the input clock signal ICLK for synchronizing the phase of the input clock signal ICLK and the phase of the feedback clock signal FCLK. The DLL core unit 110 may delay the input clock signal ICLK to output an output clock signal OCLK, in response to an output signal from the phase detector 130. The output clock signal OCLK may lead the phase of the input clock signal ICLK (or the phase of the feedback clock signal FCLK) by a value corresponding to a delay compensation time in the delay compensation circuit 120.

The DLL core unit 110 may include an analog DLL core 111 and a digital DLL core 112. The analog DLL core 111 and the digital DLL core 112 may perform the above-described operation of the DLL core unit 110. The DLL circuit 100 may be referred to as a hybrid DLL circuit because it uses the analog DLL core 111 and the digital DLL core 112.

The analog DLL core 111 may receive the input clock signal ICLK having a first frequency to perform a lock operation. The first frequency may be referred to as a high frequency. The analog DLL core 111 may include a differential amplifier type of analog delay cell having a first speed of operation and a first power consumption. The analog DLL core 111 may include a plurality of the analog delay cells.

The digital DLL core 112 may receive the input clock signal ICLK having a second frequency equal to or lower than the first frequency to perform a lock operation. The second frequency may be referred to as a low frequency. The digital DLL core 112 may include an inverter type of digital delay cell that has a second speed of operation equal to or lower than the first speed of operation and a second power consumption equal to or lower than the first power consumption. The digital DLL core 112 may include a plurality of the digital delay cells.

The analog DLL core 111 and the digital DLL core 112 share an analog type duty cycle correction circuit (not shown). A duty cycle correction range of the analog type duty cycle correction circuit may be greater than the duty cycle correction range of a digital type duty cycle correction circuit.

In the DLL circuit 100, only one of the analog DLL core 111 or the digital DLL core 112 may operate selectively. The first or second frequency may be an operation frequency (for e.g., a system frequency) of a semiconductor memory device.

Since the speed of operation of the analog delay cell included in the analog DLL core 111 is higher than the speed of operation of the digital delay cell included in the digital DLL core 112, the speed of operation of the analog DLL core 111 may be higher than the speed of operation of the digital DLL core 112.

Figure 2:
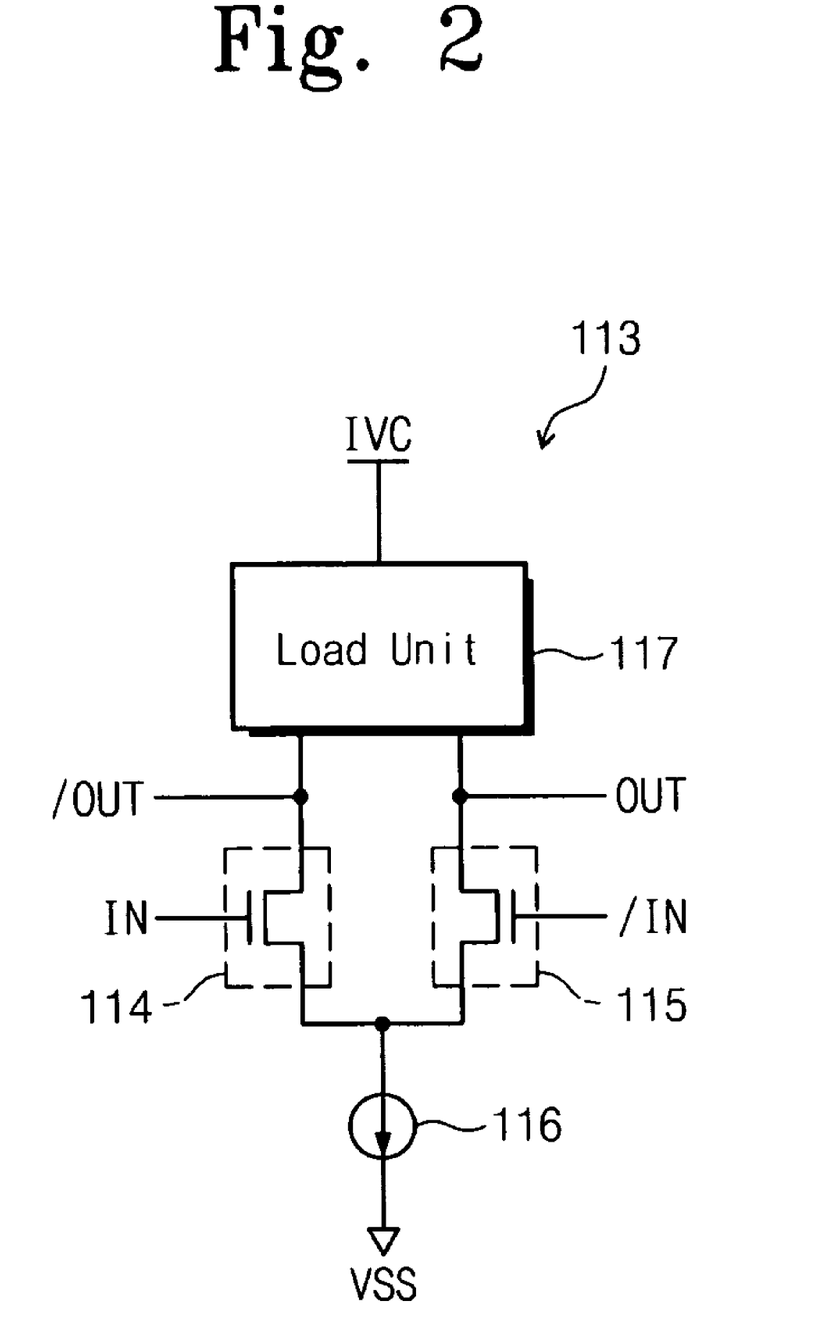
FIG. 2 is a circuit diagram illustrating an example embodiment of an analog delay cell included in the analog DLL core of FIG. 1.

FIG. 2 is a circuit diagram illustrating an example embodiment of an analog delay cell included in the analog DLL core 111 of FIG. 1.

Referring to FIG. 2, the analog delay cell 113 may include a first input unit 114, a second input unit 115, a current source 116, and a load unit 117. The analog delay cell 113 may delay an input signal IN to generate an output signal OUT, and is a differential amplifier type of delay cell.

First and second input transistors 114 and 115 may be NMOS transistors, for example. The input signal IN is input to the gate of the first input transistor 114, and signal /IN, an inverted version of input signal IN, is input to the gate of the second input transistor 115.

The input signal IN may be the input clock signal ICLK in FIG. 1 or the delayed version of the input clock signal ICLK.

The output signal OUT is output from the drain of the second input transistor 115, and the signal /OUT of the output signal OUT, an inverted version of the output signal OUT, is output from the drain of the first input transistor 114.

The load unit 117 may include a resistor. An internal power source voltage IVC is applied to the load unit 117.

When the analog delay cell 113 operates, an operation current may flow through the current source 116. When the DLL circuit uses a plurality of analog delay cells, the value of the operation current may increase, thereby increasing power consumption. A power consumed in the analog DLL circuit, for example, may be twice as high as the power consumed in the DLL circuit including a digital delay cell.

However, since differential input signals IN and /IN are input to the analog delay cell 113, the operation speed of the analog delay cell 113 may be relatively higher. Accordingly, the analog DLL circuit including the analog delay cell 113 may be less susceptible to external noise, and may be used when a valid data window is small. The external noise, for example, may include noise due to an external power source voltage.

The analog DLL circuit can also be used when the period of the input clock signal is small, thereby performing a high-speed operation. The duty cycle correction range of the clock signal of the analog DLL circuit may be greater than that of the digital DLL circuit.

In the digital delay cell, since an operation current flows only when an input signal switches between a low and high level, the power consumption of the digital DLL circuit including the digital delay cell may be lower (about 50%) than that of the analog DLL circuit.

The digital delay cell may operate in response to an input signal having a large swing width (for example, the swing width from the internal power source voltage IVC to a ground voltage VSS), and thus the operation speed of the digital delay cell can be lower than that of the analog delay cell.

Since the operation speed of the analog delay cell included in the analog DLL core 111 is higher than that of the digital delay cell included in the digital DLL core 112, the operation speed of the analog DLL core 111 may be higher than that of the digital DLL core 112.

As described above, the delay locked loop circuit according to an example embodiment may operate in a high-speed mode using the analog DLL core 111 and may operate in a current reduction mode by using the digital DLL core 112 that operates at low speed.

Accordingly, the example delay locked loop circuit and operation method thereof efficiently manage (for e.g., reduce) power consumption of a semiconductor memory device including the delay locked loop circuit.

Moreover, since the DLL circuit according to the example embodiment includes an analog type duty cycle correction circuit, the DLL circuit may generate an output clock signal having a duty cycle of about 50%.

Referring again to FIG. 1, the delay compensation circuit 120 may delay the output clock signal OCLK by the delay compensation time to generate the feedback clock signal FCLK. The feedback clock signal FCLK may be provided to the duty cycle correction circuit included in each of the analog DLL core 111 and the digital DLL core 112.

The delay compensation time, for example, may be a data output time tSAC in a semiconductor memory device such as Synchronous Dynamic Random Access Memory (SDRAM). The data output time tSAC is a time from the input of the output clock signal OCLK to the data output buffer 170 included in the semiconductor memory device and data to a time data is output from the data output buffer 170.

The delay compensation circuit 120, when included in the semiconductor memory device, may be somewhat similar to the data output buffer 170 and may compensate for the delay time tSAC in the data output buffer 170.

The phase detector 130 may detect the phase difference between the input clock signal ICLK and the feedback clock signal FCLK and may generate an output signal corresponding to the phase difference. The phase detector 130 may include a charge pump circuit and a low pass filter. The phase detector 130 may be implemented with an XOR gate or a flip-flop.

The clock buffer 140 may buffer the input clock signal ICLK input using a clock pad 160. The clock buffer 140 may be referred to as an input buffer.

The DLL control unit 150 may control the overall operation of the DLL core unit 110 in response to the input clock signal ICLK. The DLL control unit 150, for example, may control the turn-on/off operation of the DLL core unit 110, the standby mode operation and active mode operation of the DLL core unit 110 and/or the change between the standby mode and the active mode.

The data output buffer 170 may output an internal output data DATA as an output data OUTPUT on a data output pad 180, in response to the output clock signal OCLK. The output data DOUT is output in synchronization with the input clock signal ICLK, and may be provided to an external device (for example, a memory controller). The internal output data DATA may be output from a memory cell array (not shown) included in the semiconductor memory device.

Figure 3:
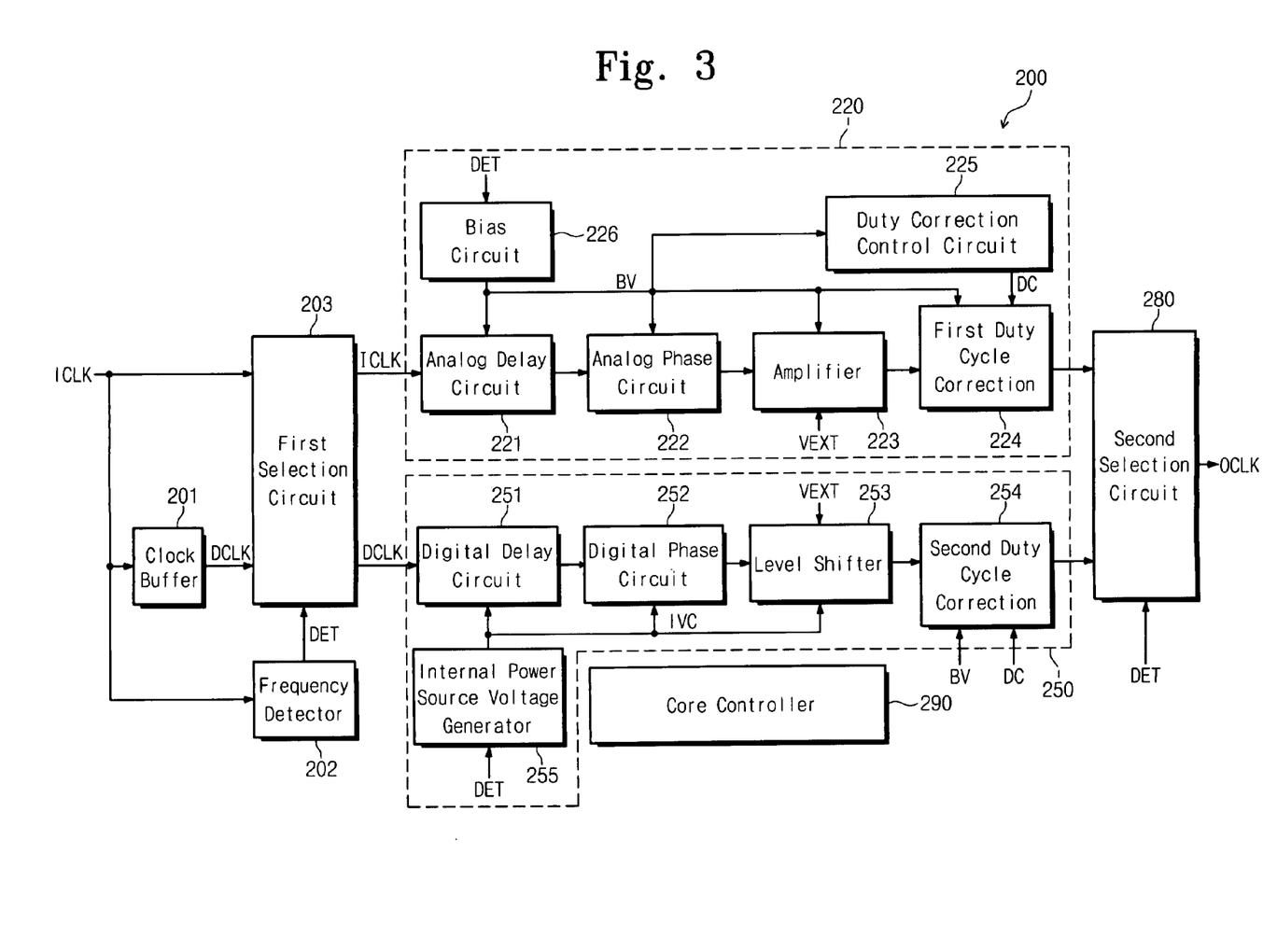
FIG. 3 is a block diagram illustrating an example embodiment of the delay locked loop core unit of FIG. 1.

FIG. 3 is a block diagram illustrating an example embodiment 200 of the DLL core unit 110 in FIG. 1.

Referring to FIG. 3, a DLL core unit 200 includes a clock buffer 201, a frequency detector 202, a first selection circuit 203, an analog DLL core 220, a digital DLL core 250, a second selection circuit 280, and a core controller 290. The analog DLL core 220 corresponds to the analog DLL core 111 in FIG. 1, and may be referred to as an analog loop. The digital DLL core 250 corresponds to the digital DLL core 112 in FIG. 1, and may be referred to as a digital loop.

The clock buffer 201 is an input buffer, and buffers an external input clock signal ICLK to output a digital clock signal DCLK. The clock buffer 201 may have an internal power source voltage IVC and a ground voltage VSS. The swing width of the input clock signal ICLK is less than that of the digital clock signal DCLK. The input clock signal ICLK is a small signal input from an external device (for example, a memory controller), and the digital clock signal DCLK is a rail-to-rail signal. For example, the swing width of the input clock signal ICLK is about 300 mV, and the swing width of the digital clock signal DCLK is about 1.5 Volt.

The frequency detector 202 detects the frequency of the input clock signal ICLK to generate a detection signal DET. For example, a high level detection signal DET may indicate the first frequency of the input clock signal ICLK, a relatively high frequency, and a low level detection signal DET may indicate a second frequency of the input clock signal ICLK, a frequency equal to or relatively lower than the first frequency.

The first selection circuit 203 selects one of the input clock signal ICLK and the digital clock signal DCLK in response to the detection signal DET. The first selection circuit 203, for example, may be implemented using a multiplexer.

The analog DLL core 220 includes an analog delay circuit 221, an analog phase circuit 222, an amplifier 223, a first duty cycle correction circuit 224, a duty correction control circuit 225, and a bias circuit 226.

The analog delay circuit 221 and the analog phase circuit 222 may delay the input clock signal ICLK to generate the output clock signal OCLK having a phase which leads the phase of the input clock signal ICLK by a value corresponding to the delay compensation time.

The analog delay circuit 221 includes at least one analog delay cell 113 of FIG. 2. The analog delay circuit 221 delays the input clock signal ICLK having the first frequency (for example, a high frequency) by a first delay time, in response to the output signal (i.e., a control signal) of the core controller 290. This output signal of core controller 290 may correspond to the output signal of the phase detector 130 of FIG. 1. The analog delay circuit 221 performs a coarse lock operation.

The analog phase circuit 222 delays the output the analog delay circuit 221 by a second delay time, shorter than the first delay time, to generate the output clock signal OCLK. The output clock signal OCLK may lead the input clock signal ICLK by the delay compensation time and may be generated in response to the output signal of the core controller 290. The analog phase circuit 222 includes the analog delay cell. The analog phase circuit 222 finely delays and outputs the output clock signal of the analog delay circuit 221. The analog phase circuit 222 performs a fine lock operation.

The amplifier 223 amplifies the swing width of the signal output from the analog phase circuit 222 to a swing width between an external power source voltage VEXT and the ground voltage VSS. The amplifier 223 is an analog amplifier including a differential amplifier having configuration similar to that of the analog delay cell. The level of the external power source voltage VEXT may be higher than that of the internal power source voltage IVC.

The first duty cycle correction circuit 224 corrects the duty cycle (for example, a duty ratio) of the output clock signal of the amplifier 223 to about 50%, in response to the control signal DC from the duty correction control circuit 225 and the feedback clock signal FCLK of FIG. 1. The first duty cycle correction circuit 224 is an analog type of duty cycle correction circuit, and may include a differential amplifier type of phase comparator similar to the analog delay cell of FIG. 2, a counter, a charge pump circuit, and a low pass filter.

Since the first duty cycle correction circuit 224 uses a differential amplifier, it can more accurately correct the duty cycle of the clock signal to about 50% than a digital duty cycle correction circuit using a digital code.

The bias circuit 226 provides a bias voltage BV to the analog delay circuit 221, the analog phase interpolator 222, the amplifier 223, the first duty cycle correction circuit 224, the duty correction control circuit 225, and a second duty cycle correction circuit 254. The bias circuit 226 operates in response to the detection signal DET. The bias circuit 226, for example, operates in response to the detection signal DET of a high level.

The digital DLL core 250 includes a digital delay circuit 251, a digital phase circuit 252, a level shifter 253, the second duty cycle correction circuit 254, and an internal power source voltage generator 255.

The digital delay circuit 251 and the digital phase circuit 252 delay a digital clock signal DCLK to generate the output clock signal OCLK. The output clock signal OCLK may have a phase which leads the phase of the input clock signal ICLK by a value corresponding to the delay compensation time.

The digital delay circuit 251 includes at least one inverter type of digital delay cell. The digital delay circuit 251 delays the digital clock signal DCLK having the second frequency (for example, low frequency) by a third delay time, in response to the output signal of the core controller 290. This output of the core controller 290 may correspond to the output signal of the phase detector 130 of FIG. 1. The digital delay circuit 251 performs a coarse lock operation.

The digital phase circuit 252 delays the output clock signal of the digital delay circuit 251 by a fourth delay time that may be equal to or shorter than the third delay time, to generate the output clock signal OCLK. The output clock signal OCLK may lead the input clock signal ICLK by the delay compensation time, and may be generated in response to the output signal of the core controller 290. The digital phase circuit 252 includes an inverter type of digital delay cell. The digital phase circuit 252 finely delays and outputs the output clock signal of the digital delay circuit 251. The digital phase circuit 252 performs a fine lock operation.

The level shifter 253 amplifies the swing width of the signal output from the digital phase circuit 252 to a swing width between the external power source voltage VEXT and the ground voltage VSS. The level shifter 253 is a digital level shifter including an inverter having configuration similar to that of the digital delay cell.

The second duty cycle correction circuit 254 corrects the duty cycle of the output clock signal of the level shifter 253 to about 50%, in response to the control signal DC of the duty correction control circuit 225. The second duty cycle correction circuit 254 may include the same elements as those of the first duty cycle correction circuit 224.

The internal power source voltage generator 255 provides the stable internal power source voltage IVC to the digital delay circuit 251, the digital phase circuit 252, and the level shifter 253. The internal power source voltage IVC is used for stabilizing the operation characteristics of the digital delay circuit 251, the digital phase circuit 252, and the level shifter 253. The internal power source voltage generator 255 operates in response to a low level of the detection signal DET, for example.

The operation characteristic of an inverter, included in each of the digital delay circuit 251, the digital phase circuit 252, and the level shifter 253, may change due to variations in according to processes, voltages and/or temperatures. The internal power source voltage generator 255 is used for compensating (i.e., removing) the change of the operation characteristic of the inverter.

The second selection circuit 280 selects one of the output clock signal of the first duty cycle correction circuit 224 and the output clock signal of the second duty cycle correction circuit 254 to generate the output clock signal OCLK. The second selection circuit 280, for example, may be implemented with a multiplexer.

The core controller 290 controls the overall operations of elements that are in the analog DLL core 220 and the digital DLL core 250, in response to the output signal of the phase detector 130 of FIG. 1 and the feedback clock signal FCLK of FIG. 1.

In a DLL core unit according to an example embodiment, the position of the amplifier 223 and the position of the first duty cycle correction circuit 224 may be switched, wherein the correction operation of the first duty cycle correction circuit 224 may be performed initially and the amplification operation of the amplifier 223 may be performed thereafter. Also, the position of the level shifter 253 and the position of the second duty cycle correction circuit 254 may be switched, wherein the correction operation of the first duty cycle correction circuit 254 may be performed initially, and the amplification operation of the amplifier 253 may be performed thereafter.

In a DLL core unit according to yet another example embodiment, the second duty cycle correction circuit 254 and the second selection circuit 280 may be omitted. In another example embodiment, the first duty cycle correction circuit 224 may correct the duty cycle of the clock signal output from the amplifier 223 or the duty cycle of the clock signal output from the level shifter 253 to generate the output clock signal OCLK. That is, the analog DLL core 220 and the digital DLL core 250 may share an analog type of duty cycle correction circuit.

As described above, DLL circuit according to an example embodiment includes the analog DLL core 220 and the digital DLL core 250 that selectively operate according to the frequency of the input clock signal, thereby decreasing power consumption.

For example, when operating the delay locked loop circuit by using the analog DLL core at a relatively low input clock frequency, a current of 7.8 mA may be consumed. When operating the delay locked loop circuit by using the digital DLL core, a current of 4.2 mA may be consumed. Accordingly, the delay locked loop circuit may achieve a power savings of about 46%.

Also, the delay locked loop circuit may include an analog type of duty cycle correction circuit (for example, the first duty cycle correction circuit 224), that may generate the output clock signal OCLK having the duty cycle of about 50%.

Figure 4:
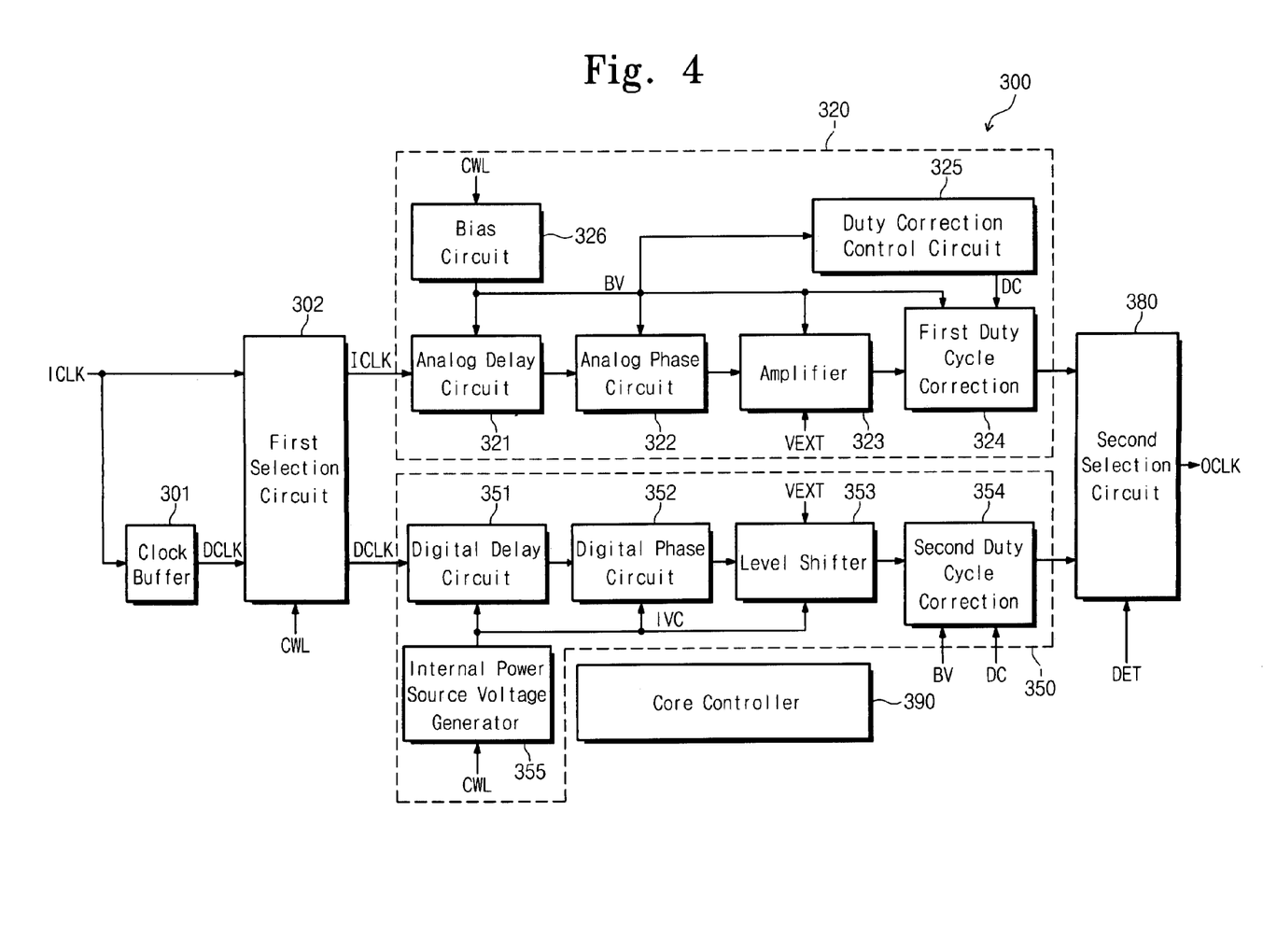
FIG. 4 is a block diagram illustrating another example embodiment of the DLL core unit of FIG. 1.

FIG. 4 is a block diagram illustrating another example embodiment of the DLL core unit 110 of FIG. 1.

Referring to FIG. 4, a DLL core unit 300 includes a clock buffer 301, a first selection circuit 302, an analog DLL core 320, a digital DLL core 350, a second selection circuit 380, and a core controller 390. The analog DLL core 320 corresponds to the analog DLL core 111 of FIG. 1, and may be referred to as an analog loop. The digital DLL core 350 corresponds to the digital DLL core 112 of FIG. 1, and may be referred to as a digital loop.

The clock buffer 301 is an input buffer, and buffers an input clock signal ICLK to output a digital clock signal DCLK having the swing width between an internal power source voltage IVC and a ground voltage VSS. The swing width of the input clock signal ICLK is less than that of the digital clock signal DCLK. The input clock signal ICLK is input from an external device, for example, and the digital clock signal DCLK is a rail-to-rail signal.

The first selection circuit 302 selects one of the input clock signal ICLK and the digital clock signal DCLK in response to a Column Address Strobe (CAS) writing latency signal CWL. The first selection circuit 302, for example, may be implemented with a multiplexer. As an example, the CAS writing latency signal CWL of a high level may indicate that the frequency of the input clock signal ICLK is a first frequency (for e.g., a relatively high frequency), and the CAS writing latency signal CWL of a low level may indicate that the frequency of the input clock signal ICLK is a second frequency (for e.g., equal to or relatively lower than the first frequency).

The CAS writing latency signal CWL is an internal signal that may be used in a semiconductor memory device. CAS writing latency denotes a delay time from a time when a writing command is input to the semiconductor memory device to a time when data are written in a memory cell. The CAS writing latency signal CWL is a signal that may be generated in a mode register of a semiconductor memory device, and may indicate the frequency information of the input clock signal ICLK.

The analog DLL core 320 includes an analog delay circuit 321, an analog phase circuit 322, an amplifier 323, a first duty cycle correction circuit 324, a duty correction control circuit 325, and a bias circuit 326.

The analog delay circuit 321 and the analog phase circuit 322 delay the input clock signal ICLK to generate the output clock signal OCLK. The output clock signal OCLK may have a phase which leads the phase of the input clock signal ICLK by a value corresponding to the delay compensation time.

The analog delay circuit 321 may correspond to the analog delay circuit 221 of FIG. 3. The configuration and operation of the analog delay circuit 321 may be similar to the configuration and operation of the analog delay circuit 221 of FIG. 3. Therefore, a detailed description thereof is omitted here for the sake of brevity.

The analog phase circuit 322 may correspond to the analog phase circuit 222 of FIG. 3. The configuration and operation of the analog phase circuit 322 may be similar to the configuration and operation of the analog phase circuit 222 of FIG. 3. Therefore, a detailed description thereof is omitted here for the sake of brevity.

The amplifier 323 may correspond to the amplifier 223 of FIG. 3. The configuration and operation of the amplifier 323 may be similar to the configuration and operation of the amplifier 223 of FIG. 3. Therefore, a detailed description thereof is omitted here for the sake of brevity.

The first duty cycle correction circuit 324 may correspond to the first duty cycle correction circuit 224 of FIG. 3. The configuration and operation of the first duty cycle correction circuit 324 may be similar to the configuration and operation of the first duty cycle correction circuit 224 of FIG. 3. Therefore, a detailed description thereof is omitted here for the sake of brevity.

The bias circuit 326 may correspond to the bias circuit 226 of FIG. 3. The configuration and operation of the bias circuit 326 may be similar to the configuration and operation of the bias circuit 226 of FIG. 3. Therefore, a detailed description thereof is omitted here for the sake of brevity.

The digital DLL core 350 includes a digital delay circuit 351, a digital phase circuit 352, a level shifter 353, the second duty cycle correction circuit 354, and an internal power source voltage generator 355.

The digital delay circuit 351 and the digital phase circuit 352 delay a digital clock signal DCLK to generate the output clock signal OCLK. The output clock signal OCLK may have a phase which leads the phase of the input clock signal ICLK by a value corresponding to the delay compensation time.

The digital delay circuit 351 may correspond to the digital delay circuit 251 of FIG. 3. The configuration and operation of the digital delay circuit 351 may be similar to the configuration and operation of the digital delay circuit 251 of FIG. 3. Therefore, a detailed description thereof is omitted here for the sake of brevity.

The digital phase circuit 352 may correspond to the digital phase circuit 252 in FIG. 3. The configuration and operation of the digital phase circuit 352 may be similar to the configuration and operation of the digital phase circuit 252 of FIG. 3. Therefore, a detailed description thereof is omitted here for the sake of brevity.

The level shifter 353 may correspond to the level shifter 253 in FIG. 3. The configuration and operation of the level shifter 353 may be similar to the configuration and operation of the level shifter 253 of FIG. 3. Therefore, a detailed description thereof is omitted here for the sake of brevity.

The second duty cycle correction circuit 354 may correspond to the second duty cycle correction circuit 254 of FIG. 3. The configuration and operation of the second duty cycle correction circuit 354 may be similar to the configuration and operation of the second duty cycle correction circuit 254 of FIG. 3. Therefore, a detailed description thereof is omitted here for the sake of brevity.

The internal power source voltage generator 355 provides a stable internal power source voltage IVC to the digital delay circuit 351, the digital phase circuit 352 and the level shifter 353. The internal power source voltage IVC is used for stabilizing the operation characteristics of the digital delay circuit 351, the digital phase circuit 352 and the level shifter 353. The internal power source voltage generator 355 operates in response to a CAS writing latency signal CWL. The internal power source voltage generator 355, for example, operates in response to the CAS writing latency signal CWL of a low level.

The operation characteristic of an inverter, included in each of the digital delay circuit 351, the digital phase circuit 352 and the level shifter 353, may vary also to changes in processes, voltages and/or temperatures. The internal power source voltage generator 355 is used for compensating (i.e., removing) the variations in the operation characteristic of the inverter.

The second selection circuit 380 selects one of the output clock signal of the first duty cycle correction circuit 324 and the output clock signal of the second duty cycle correction circuit 354 to generate an output clock signal OCLK. The second selection circuit 380, for example, may be implemented with a multiplexer.

The core controller 390 may correspond to the core controller 290 of FIG. 3. The configuration and operation of the core controller 390 may be similar to the configuration and operation of the core controller 290 of FIG. 3. Therefore, a detailed description thereof is omitted here for the sake of brevity.

In a DLL core unit according to another example embodiment, the position of the amplifier 323 and the position of the first duty cycle correction circuit 324 may be switched, wherein the correction operation of the first duty cycle correction circuit 324 is performed initially, and the amplification operation of the amplifier 323 may be performed thereafter. Also, the position of the level shifter 353 and the position of the second duty cycle correction circuit 354 may be switched, wherein the correction operation of the first duty cycle correction circuit 354 is initially performed, and the amplification operation of the amplifier 353 may be performed thereafter.

In a DLL core unit according to another example embodiment, the second duty cycle correction circuit 354 and the second selection circuit 380 may be omitted. In such a case, the first duty cycle correction circuit 324 may correct the duty cycle of the output clock signal of the amplifier 323 or the duty cycle of the output clock signal of the level shifter 353 to generate the output clock signal OCLK.

As described above, the DLL circuit includes the analog DLL core 320 and the digital DLL core 350 that selectively operate according to the frequency of the input clock signal, thereby decreasing power consumption.

Also, the delay locked loop circuit may include an analog type of duty cycle correction circuit (for example, 324), that may generate the output clock signal OCLK having the duty cycle of about 50%.

Figure 5:
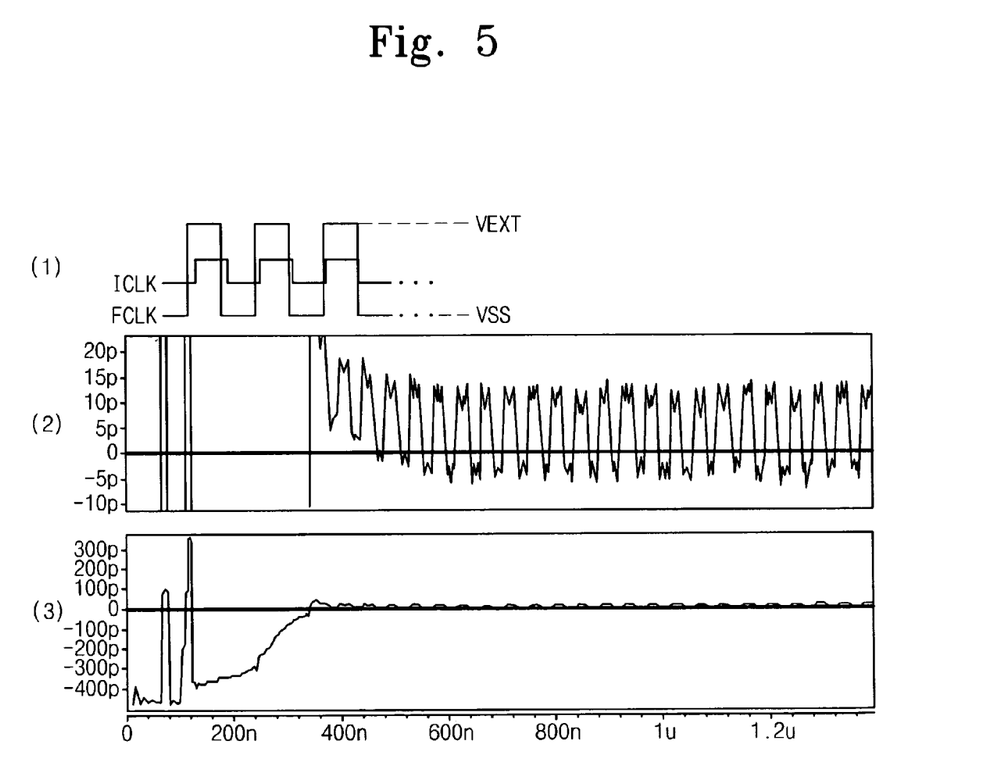
FIG. 5 illustrates waveforms indicating the operation of the delay locked loop circuit of FIG. 1.

FIG. 5 is a diagram illustrating waveforms on the operation of the delay locked loop circuit according to an example embodiment.

FIG. 5 illustrates an input clock signal ICLK having a period of about 1 ns and a duty cycle error of about 5% and which has a phase leading the phase of a feedback clock signal FCLK by a value corresponding to about 400 ps is inputted to the digital DLL core.

Referring to the first waveform, the phase of the feedback clock signal FCLK is synchronized with the phase of the input clock signal ICLK, and the duty cycle of the feedback clock signal FCLK is corrected to about 50%. The feedback clock signal FCLK swings between an external power source voltage VEXT and a ground voltage VSS.

Referring to the third waveform, the phase difference between the input clock signal ICLK and the feedback clock signal FCLK becomes 0 degree around 400 ms. That is, the phase of the input clock signal ICLK and the phase of the feedback clock signal FCLK are synchronized.

The second waveform is one where the third waveform has been zoomed in and represents the jitter in a phase difference. The jitter is about 20 ps.

A description on the above-described DLL circuit according to embodiments of the inventive concept may be applied to the operation method of the delay locked loop circuit according to embodiments of the inventive concept.

The DLL circuit and operation method thereof according to example embodiments may use the digital DLL core having relatively low power consumption at a relatively low operation speed (i.e., a frequency of a relatively low input clock signal) and may use the analog DLL core having relatively high power consumption is relatively high, at a relatively high operation speed.

Accordingly, the delay locked loop circuit may efficiently reduce power consumption in the semiconductor memory device.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A delay locked loop circuit, comprising:
a first Delay Locked Loop (DLL) core receiving an input clock signal of a first frequency; and
a second DLL core receiving the input clock signal of a second frequency equal to or lower than the first frequency,
wherein the first DLL core is an analog DLL core, the second DLL core is a digital DLL core and one of the first and second DLL cores operates selectively,
wherein the analog DLL core includes,
an analog delay circuit having at least one analog delay cell, the analog delay circuit delaying the input clock signal having the first frequency by a first delay time,
an analog phase circuit configured to delay an output of the analog delay circuit by a second delay time to generate a first output signal, and
a bias circuit configured to provide a bias voltage to the analog delay circuit and the analog phase circuit in response to a detection signal from a frequency detector which detects the frequency of the input clock signal, and
the digital DLL core includes,
a digital delay circuit having at least one digital delay cell, the digital delay circuit configured to delay the input clock signal having the second frequency by a third delay time,
a digital phase circuit configured to delay an output of the digital delay circuit by a fourth delay time to generate a second output signal, and
an internal power source voltage generator configured to supply a stable internal power source voltage to the digital delay circuit, the digital phase circuit, and a digital level shifter; and
a selection circuit configured to select one of the first and second DLL cores, wherein
the selection circuit is configured to select the first DLL core when the detection signal from the frequency detector is a first level, and
the selection circuit is configured to select the second DLL core when the detection signal from the frequency detector is a second level,
the second level being opposite to the first level.

2. The delay locked loop circuit of claim 1, wherein:
the analog DLL core further includes at least one differential amplifier type of delay cell having a first speed of operation and a first consumption power, and
the digital DLL core further includes at least one inverter type of delay cell which has a second speed of operation equal to or lower than the first speed of operation and a second consumption power equal to or lower than the first consumption power.

3. A delay locked loop circuit, comprising:
a first Delay Locked Loop (DLL) core receiving an input clock signal of a first frequency; and
a second DLL core receiving the input clock signal of a second frequency equal to or lower than the first frequency,
wherein the first DLL core is an analog DLL core, the second DLL core is a digital DLL core and one of the first and second DLL cores operates selectively,
wherein the analog DLL core includes,
an analog delay circuit having at least one analog delay cell, the analog delay circuit delaying the input clock signal having the first frequency by a first delay time,
an analog phase circuit configured to delay an output of the analog delay circuit by a second delay time to generate a first output signal, and
a bias circuit configured to provide a bias voltage to the analog delay circuit and the analog phase circuit in response to a detection signal from a frequency detector which detects the frequency of the input clock signal, and
the digital DLL core includes,
a digital delay circuit having at least one digital delay cell, the digital delay circuit configured to delay the input clock signal having the second frequency by a third delay time,
a digital phase circuit configured to delay an output of the digital delay circuit by a fourth delay time to generate a second output signal, and
an internal power source voltage generator configured to supply a stable internal power source voltage to the digital delay circuit, the digital phase circuit, and a digital level shifter; and
a selection circuit configured to select one of the first and second DLL cores, wherein
the selection circuit is configured to select the first DLL core when a column address strobe writing latency signal (CWL) indicates frequency information of the input clock signal is a first level, and
the selection circuit is configured to select the second DLL core when the column address strobe writing latency signal (CWL) is a second level,
the second level being opposite the first level.

4. The delay locked loop circuit of claim 3, wherein:
the analog DLL core further includes at least one differential amplifier type of delay cell having a first speed of operation and a first consumption power, and
the digital DLL core further includes at least one inverter type of delay cell which has a second speed of operation equal to or lower than the first speed of operation and a second consumption power equal to or lower than the first consumption power.

5. A delay locked loop circuit, comprising:
a first Delay Locked Loop (DLL) core receiving an input clock signal of a first frequency; and
a second DLL core receiving the input clock signal of a second frequency equal to or lower than the first frequency,
wherein the first DLL core is an analog DLL core, the second DLL core is a digital DLL core and one of the first and second DLL cores operates selectively,
wherein the analog DLL core includes,
  an analog delay circuit having at least one analog delay cell, the analog delay circuit delaying the input clock signal having the first frequency by a first delay time,
  an analog phase circuit configured to delay an output of the analog delay circuit by a second delay time to generate a first output signal,
  a bias circuit configured to provide a bias voltage to the analog delay circuit and the analog phase circuit in response to a detection signal from a frequency detector which detects the frequency of the input clock signal,
  an analog amplifier configured to receive the output of the analog phase circuit and generate an amplified first output signal; and
  a first duty cycle correction circuit configured to correct a duty cycle of the amplified first output signal in response to an output of a duty correction control circuit, and
the digital DLL core includes,
  a digital delay circuit having at least one digital delay cell, the digital delay circuit configured to delay the input clock signal having the second frequency by a third delay time,
  a digital phase circuit configured to delay an output of the digital delay circuit by a fourth delay time to generate a second output signal, and
  an internal power source voltage generator configured to supply a stable internal power source voltage to the digital delay circuit, the digital phase circuit, and a digital level shifter,
    the digital level shifter configured to receive the output of the digital phase circuit and to generate the second output signal having an amplified swing width, and
  a second duty cycle correction circuit configured to correct a duty cycle of the second output signal having the amplified swing width in response to the output of the duty correction control circuit.

6. The delay locked loop circuit of claim 5, wherein a selection circuit selectively outputs the amplified first output signal and the second output signal having the amplified swing width as an output clock signal of the delay locked loop circuit.

7. The delay locked loop circuit of claim 6, wherein a phase of the clock signal output from the selection circuit leads a phase of the input clock signal.

8. The delay locked loop circuit of claim 5, wherein the bias circuit is further configured to provide the bias voltage to the analog amplifier, the first and second duty cycle correction circuits and the duty correction control circuit in response to the detection signal from the frequency detector.

9. The delay locked loop circuit of claim 5, wherein the bias circuit is further configured to provide the bias voltage to the analog amplifier, the first and second duty cycle correction circuits and the duty correction control circuit in response to a column address strobe writing latency signal that indicates the frequency of the input clock signal.

10. A delay locked loop circuit, comprising:
a first Delay Locked Loop (DLL) core receiving an input clock signal of a first frequency; and
a second DLL core receiving the input clock signal of a second frequency equal to or lower than the first frequency,
wherein the first DLL core is an analog DLL core, the second DLL core is a digital DLL core and one of the first and second DLL cores operates selectively,
wherein the analog DLL core includes,
  an analog delay circuit having at least one analog delay cell, the analog delay circuit delaying the input clock signal having the first frequency by a first delay time,
  an analog phase circuit configured to delay an output of the analog delay circuit by a second delay time to generate a first output signal, and
  a bias circuit configured to provide a bias voltage to the analog delay circuit and the analog phase circuit in response to a detection signal from a frequency detector which detects the frequency of the input clock signal,
  a first duty cycle correction circuit configured to correct a duty cycle of the first output signal output from the analog phase circuit; and
  an analog amplifier configured to receive the first output signal output from the analog phase circuit and generate an amplified first output signal; and
the digital DLL core includes,
  a digital delay circuit having at least one digital delay cell, the digital delay circuit configured to delay the input clock signal having the second frequency by a third delay time,
  a digital phase circuit configured to delay an output of the digital delay circuit by a fourth delay time to generate a second output signal, and
  an internal power source voltage generator configured to supply a stable internal power source voltage to the digital delay circuit, the digital phase circuit, and a digital level shifter,
  a second duty cycle correction circuit configured to correct a duty cycle of the second output signal output from the digital phase circuit, and
  a digital level shifter configured to receive the second output signal output from the digital phase circuit and generate the second output signal having an amplified swing width.

* * * * *